United States Patent [19]

Brown

[11] Patent Number: 4,539,525
[45] Date of Patent: Sep. 3, 1985

[54] BAND-PASS AMPLIFIER FILTERS

[75] Inventor: Neil L. Brown, Bourne, Mass.

[73] Assignee: Neil Brown Instrument Systems, Inc., Cataumet, Mass.

[21] Appl. No.: 422,732

[22] Filed: Sep. 24, 1982

[51] Int. Cl.³ .............................. H03F 3/04; H03F 1/34
[52] U.S. Cl. ...................................... 330/107; 330/306
[58] Field of Search ......................... 330/107, 109, 306

[56] References Cited

U.S. PATENT DOCUMENTS 4,122,417 10/1978 Takasaki et al. .................... 330/107

Primary Examiner—James B. Mullins
Assistant Examiner—G. Wan
Attorney, Agent, or Firm—Lee & Hollander

[57] ABSTRACT

A two-stage band-pass amplifier filter circuit which uses a bi-quad amplifier in each stage, the bi-quad amplifier being connected between an AC feedback amplifier in the signal transmission path and ground. The bi-quad amplifiers each provide a variable impedance and effectively operate as series-resonant circuits such that, during closed loop operation, the overall amplifier-filter circuit has a high gain at or near resonance and a very low gain off-resonance and has a phase shift of 0° at resonance and ±90° substantially off-resonance. The bi-quad amplifiers are connected to the feedback resistance of the signal path amplifier via a coupling resistance, the signal path amplifier feedback resistance being greater than the coupling resistance, normally by a factor as high as 20 to 1, so that the bi-quad amplifier is thereby prevented from overloading during operation.

11 Claims, 11 Drawing Figures

SECOND STAGE

BAND-PASS AMPLIFIER FILTERS

INTRODUCTION

This invention relates to band-pass amplifier filter circuits and, more particularly, to such circuits which use active elements such as bi-quad amplifiers therein.

BACKGROUND OF THE INVENTION

In many applications it is necessary to use band-pass filters which provide selected amplitude and phase characteristics. Thus, in many cases it is desirable that the amplitude vs. frequency characteristics have a substantially flat response (a substantially constant and relatively high gain) in the relatively narrow pass band region about a center resonant frequency, $f_r$, and be extremely small (relatively low gain) at all other frequencies, effectively approaching zero at extreme off-resonant frequencies. It is further desirable that the phase shift be zero over the narrow pass band region.

A band-pass amplifier-filter configuration which has found success in the prior art is described in my copending application, Ser. No. 422,733, entitled "Systems for Providing Digital Representations of Analog Values," filed concurrently with, and having the same filing date as, this application. The two stage band-pass amplifier-filter circuit described in such copending application utilizes a pair of series-cascased bi-quad amplifiers following a preamplifier circuit. Such circuit effectively provides extremely high open loop gain at the resonant frequency, i.e., at the center frequency of the pass band, which in the particular system discussed therein was selected at 384 Hz. The overall circuit is made completely stable under closed loop conditions through the use of a pair of resistors suitably arranged as described therein.

The band-pass circuit which is so described appears to provide satisfactory operation under normal conditions so long as the input signal thereto does not exceed a value at which the amplifier overloads. When overload occurs, however, the phase shift of the bi-quad amplifier becomes abnormal and the circuit becomes unstable during closed loop operation and is unable to recover from such instability and is thus not able to resume its normal desired operation even when the input signal falls below such overload level. The only effective way to cause the circuit to recover and to return to its normal operating state is to remove the excitation power supplied thereto and to let the components settle down before resuming a power-on condition. Such a procedure is clearly disadvantageous in most applications and it is desirable that the band-pass filter be designed so as to permit a graceful recovery following overload without the need to shut off power.

DESCRIPTION OF THE INVENTION

In accordance with the invention, a band-pass amplifier-filter circuit is arranged so that the bi-quad amplifier is not utilized in the direct signal transmission path but rather is used in a feedback transmission path in both stages. The values of the feedback resistors are arranged so that their ratio is such that the impedance looking into the feedback path is very low at the resonant frequency. Such arrangement assures that the bi-quad amplifier always operates within its saturation limits and, accordingly, it never becomes overloaded during operation. Should the input signal exceed a level at which the direct signal transmission path components overload, the direct path components can recover satisfactorily. Accordingly, when an overload signal occurs, the bi-quad amplifier circuit is not adversely affected thereby while the remaining circuitry can recover to its normal operating state without the need to shut off power.

DESCRIPTION OF THE INVENTION

DESCRIPTION OF THE PREFERRED EMBODIMENT

Figure 3:
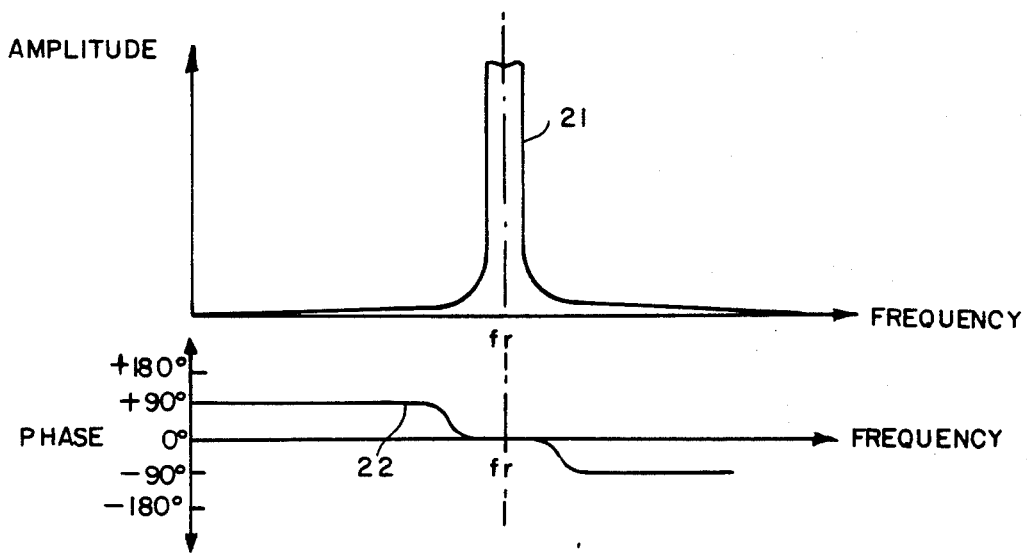
FIG. 3 shows an exemplary graph of the desired amplitude and phase characteristics for closed loop operation of a band-pass amplifier-filter in accordance with an invention.

It is desirable that band-pass amplifier-filters in accordance with the invention provide closed loop amplitude and phase characteristics shown by the exemplary curves of FIG. 3. The amplitude vs. frequency characteristic depicted by curve 21 provides a substantially flat response (a relatively high constant gain) in the relatively narrow pass band region about the center frequency, $f_r$, and is very low at frequencies outside but relatively close to the resonant frequency, and effectively reduces to essentially zero at extreme off-resonant frequencies. The phase shift depicted by solid line curve 22 is essentially zero over the narrow pass band region and is effectively $+90°$ or $-90°$ elsewhere, as shown.

Figure 1:
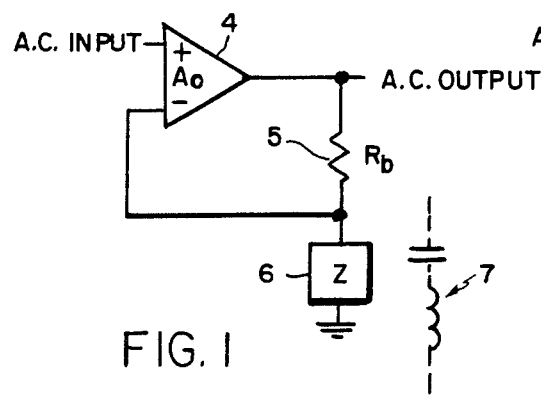
FIG. 1 shows a simplified block diagram of a single stage circuit having the desired characteristics for use in the invention.

FIG. 1 depicts a simplified diagram of a circuit configuration which can be used in an overall circuit for achieving such characteristics. As seen therein an amplifier 4 (designated as $A_o$) is supplied with an AC input signal and supplies an AC output signal. The amplifier 4 uses a feedback resistance 5 (having a resistance value $R_b$) which is connected to ground via an impedance circuit 6, the impedance Z of which varies in the same manner as that of a series-resonant L-C circuit 7, depicted in phantom adjacent impedance circuit 6. If the open loop gain of the amplifier is extremely high (effectively $A_o = \infty$), the closed loop gain A can be expressed as $$A = (R_b + Z)/Z.$$

Figure 2:
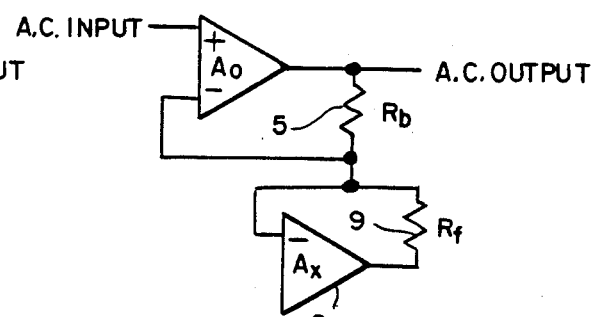
FIG. 2 shows the circuit of FIG. 1 wherein the variable impedance thereof is implemented by active elements.

The active circuit for providing the desired impedance characteristics is shown in simplified form in the configuration of FIG. 2 as comprising an active amplifier 8 having a variable gain $A_x$ and a feedback resistance 9 (having a resistance value $R_f$) so that the impedance Z thereof can be expressed as $$Z = R_f/(A_x + 1).$$

Figure 4:
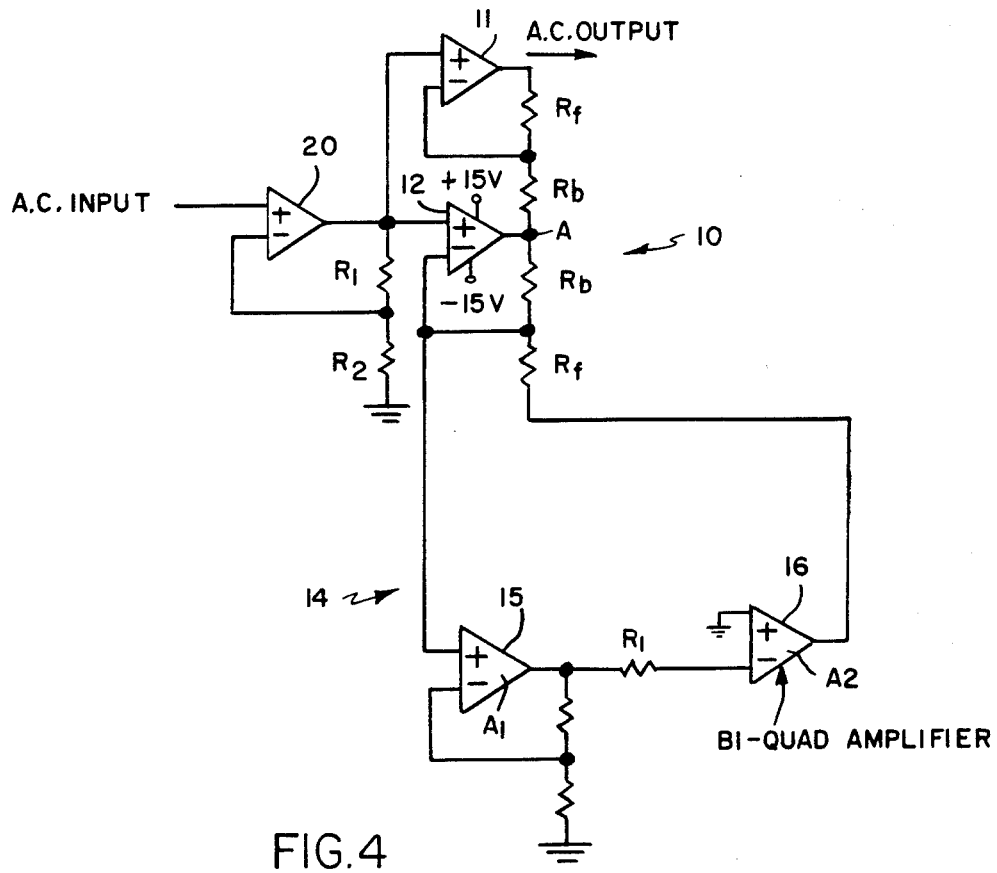
FIG. 4 shows a circuit diagram of a particular embodiment of one stage of a band-pass amplifier-filter in accordance with the invention.

A specific configuration for one stage of an overall band-pass amplifier-filter in accordance with the invention is shown in FIG. 4 which utilizes an operational amplifier (op-amp) 12 and associated circuitry in the upper portion 10 of the circuit to provide an amplifier circuit in the direct transmission path. The lower portion 14 thereof forms a tuned circuit the impedance of which varies in a manner so as to provide operating characteristics of a series-resonant L-C circuit. An input preamplifier circuit 20 provides an input signal to op-amp 12, as shown. The lower portion 14 comprises, in effect, a first amplifier $A_1$ identified as op-amp 15 and a second amplifier $A_2$ identified as a bi-quad amplifier 16.

Bi-quad amplifiers are known to the art and are discussed, for example, in the text, "Rapid Practical Designs of Active Filters", Johnson and Hilburn, John Wiley & Sons, 1975.

Figure 5:
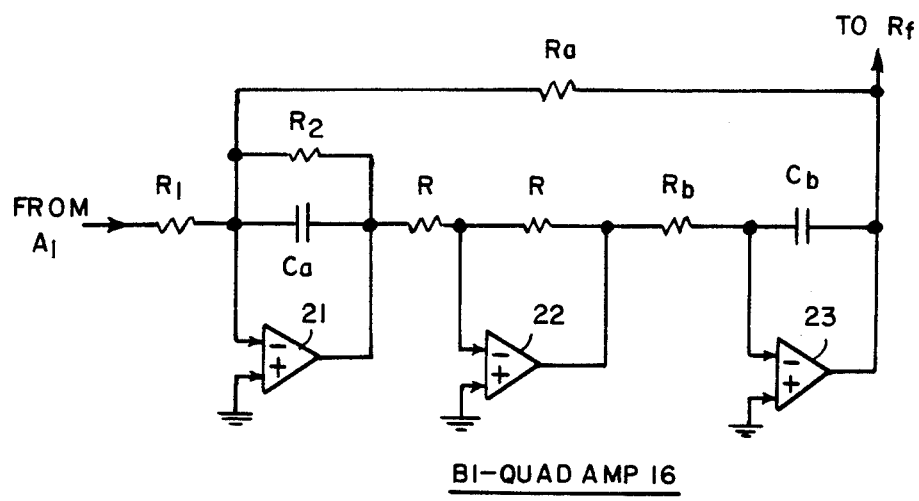
FIG. 5 shows a general operational configuration of a bi-quad amplifier of the type which can be used in the embodiment of FIG. 4.

Although not necessarily implemented in such manner, bi-quad amplifiers can be thought of as having a general operational configuration as shown in FIG. 5 which, in effect, comprises three operational amplifier stages in series including a first op-amp 21, a second op-amp 22, and a third op-amp 23, the overall stages having a closed loop feedback resistor $R_a$ connected from the output of op-amp 23 to the input of op-amp 21.

Figure 6:
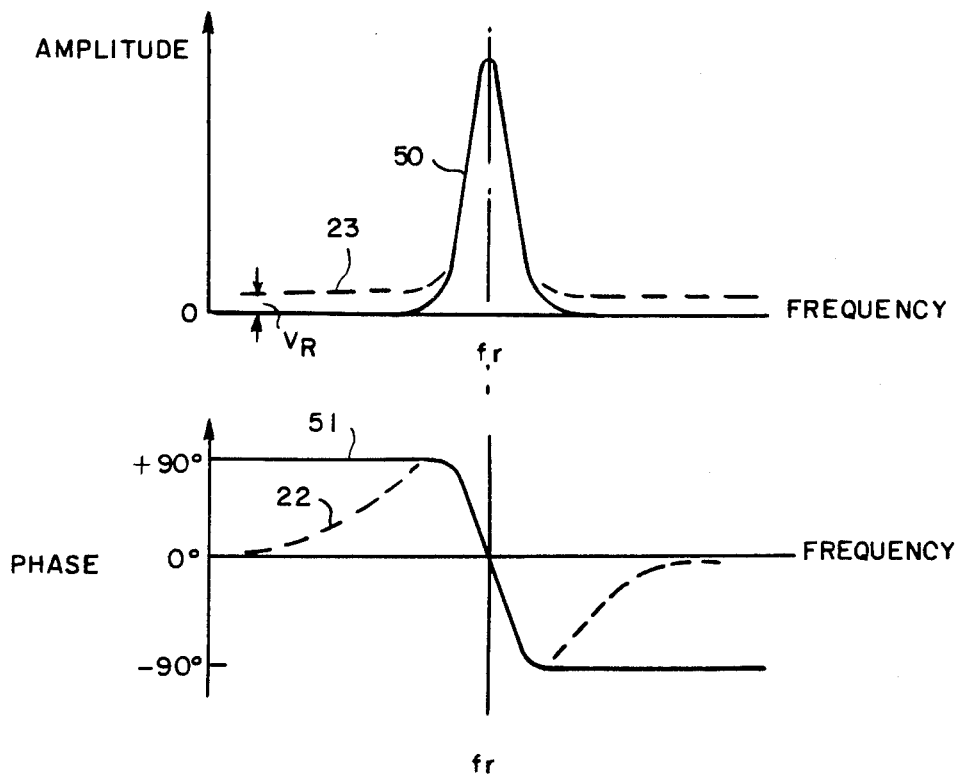
FIG. 6 shows exemplary amplitude and phase characteristics for open loop operation of each of two stages of a band-pass amplifier generally of the type shown in FIG. 4.

The open loop amplitude and phase characteristics of the overall amplifier stage of FIG. 4 are shown in FIG. 6. Thus, the amplitude vs. frequency characteristic rises from a zero value to a relatively high peak at the center, or resonant, frequency $f_r$, as shown by solid curve 50, and thence to zero at frequencies above $f_r$. The phase is approximately $+90°$ below resonance and passes through $0°$ at the center or resonance frequency $f_r$ to approximately $-90°$ above resonance as shown by solid curve 51.

When using a bi-quad amplifier, relatively high Q's can be achieved particularly at the low audio frequencies used here (i.e., where the resonant frequency is 384 Hz). It is further advantageous that with bi-quad amplifiers, once the resonant or center frequency is selected, the Q can be selected independently of the center frequency and the gain can be selected independently of both the center frequency and the Q. As mentioned above, the phase shift and Q of the amplifier will be stable so long as the bi-quad amplifier does not overload. However, at overload the phase becomes abnormal and the amplifier cannot recover without power shut-off. Because of the inability of the amplifier to recover in a satisfactory manner after overload occurs, it is important that it not overload during operation. To assure such condition the active circuit using the bi-quad amplifier is used in a path between the output and ground rather than in the direct transmission path as shown in FIG. 4 and discussed with reference to the configurations of FIGS. 1 and 2, with the value of the resistance $R_f$ therein being made lower than the value of the resistance $R_b$. In FIG. 4 the impedance $Z_f$ looking into $R_f$ is equal to $R_f/(A_1A_2) + 1$, as desired, where $A_1$ and $A_2$ are the respective gains of op-amp 15 and bi-quad amplifier 16. The value of $R_f$ is lower than that of $R_b$, thereby assuring that the bi-quad amplifier always operates within its saturation limits and, hence, never becomes overloaded during operation.

If the circuit of FIG. 4 uses only op-amp 12 in its direct transmission path, it may tend to have a small residual gain off resonance as depicted by the dashed-line curve 23 in FIG. 6 and will have a phase characteristic which rises from zero well below resonance to $+90°$ and thence through $0°$ at resonance to $-90°$ and back to $0°$ well above resonance as shown by dashed line curve 22. In order to assure that the amplitude characteristic of the overall band-pass filter is such that the gain is substantially zero off-resonance, the circuit must be designed so that the tendency to give rise to such small residual gain (effectively determined by the values of $R_b$ and $R_f$) is substantially eliminated. For such purpose the circuit of FIG. 4 utilizes the differential amplifier 11 which effectively compares the voltage difference between the voltage level at point A and the input voltage from preamplifier 20 so as to reduce such difference to zero and thereby assure that the output voltage taken at the output of operational amplifier 11 goes to zero at frequencies off the resonant frequency $f_r$ in the desired manner shown by curve 50 of FIG. 1. In addition, the latter circuitry causes the phase characteristic to conform to curve 51.

Figure 8:
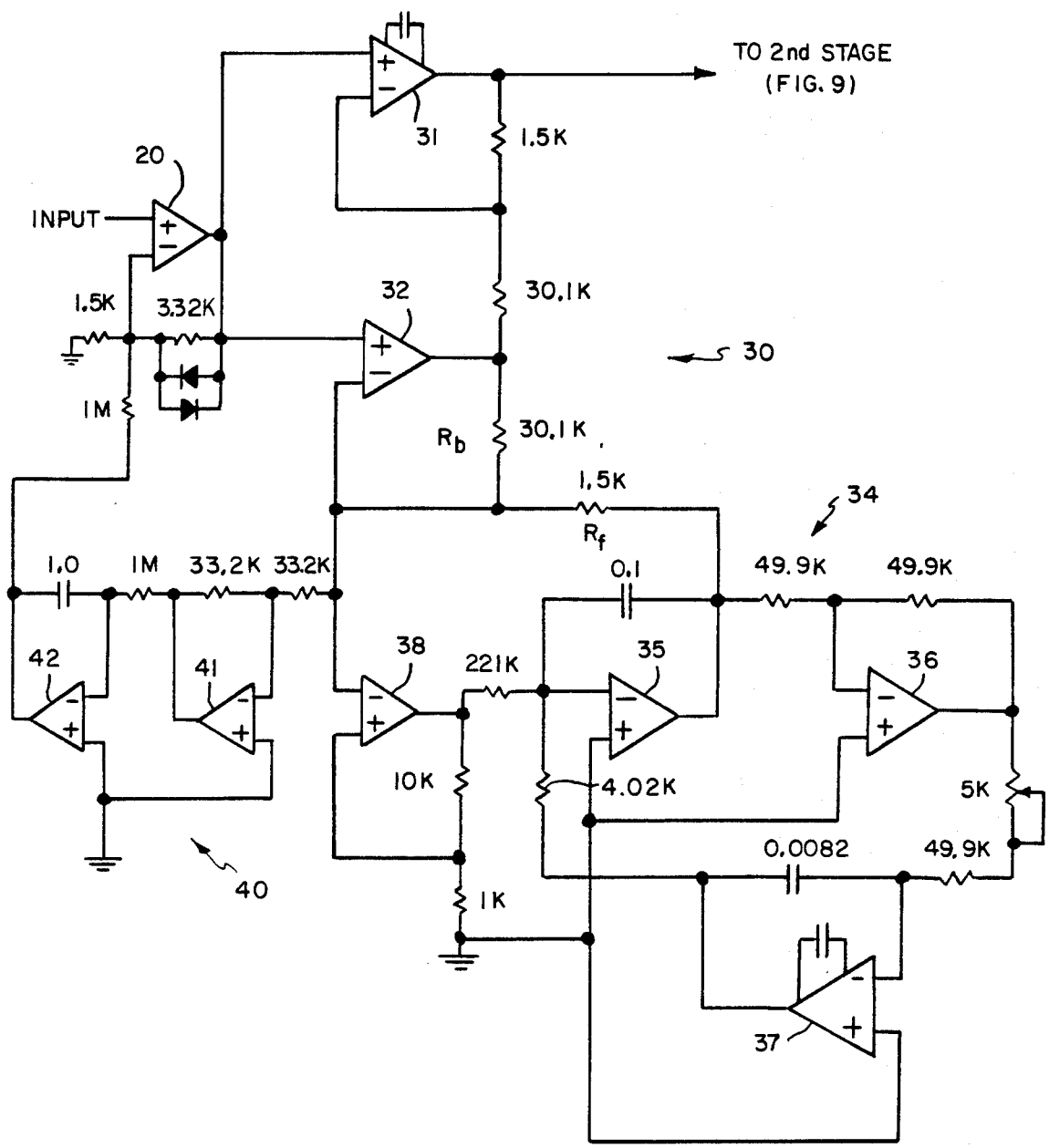
FIG. 8 shows in more detail specific circuitry for a first stage of an overall band-pass amplifier-filter in accordance with the invention.

A more specific embodiment of the first stage of a band-pass amplifier-filter in accordance with the invention is depicted in FIG. 8 wherein the upper portion in the direct transmission path includes op-amp 32 supplied with the output from preamplifier 20 and differential op-amp 31 for cancelling the residual gain off-resonance as discussed above, the output being supplied to the second stage at the output of op-amp 31 as shown. The lower portion 34 in the path between the output and ground includes a bi-quad amplifier circuit, equivalent to amplifier $A_2$ of FIG. 4, which comprises op-amps 35, 36 and 37 and their associated circuits and op-amp 38 equivalent to amplifier $A_1$ of FIG. 4. The specific values depicted in each circuit provide a center frequency of 384 Hz and a Q of about 2000 and the amplitude and phase characteristics are as shown by curves 50 and 51 of FIG. 6.

If the gain of the preamplifier 20 is relatively high (e.g., a gain over 30) there may be an undesirable D-C offset voltage at its output which should be eliminated. The feedback circuit 40 comprising op-amps 41 and 42 and their associated circuitry can be used to cancel such D-C offset.

A further second stage of amplification can be cascaded with that shown in FIG. 8 to form an overall circuit. However, if a circuit of the configuration shown in FIG. 8, with a phase characteristic of curve 51 in FIG. 6, is used as the second cascaded stage its phase characteristic combined with that of the first stage, will produce overall phase shifts of $\pm 180°$ off-resonance which characteristic will tend to make the overall operation unstable.

Figure 7:
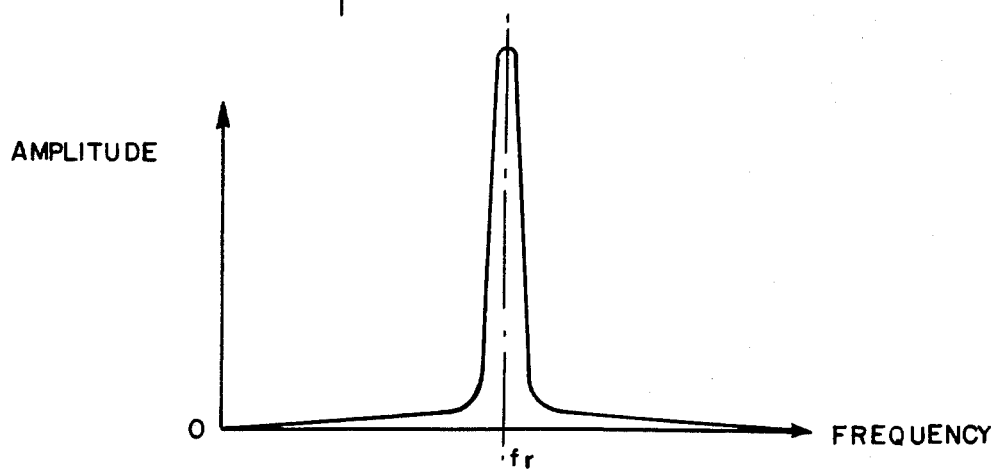
FIG. 7 shows exemplary overall amplitude and phase characteristics of a two stage band-pass amplifier having the characteristics depicted in FIG. 6.
Figure 7:
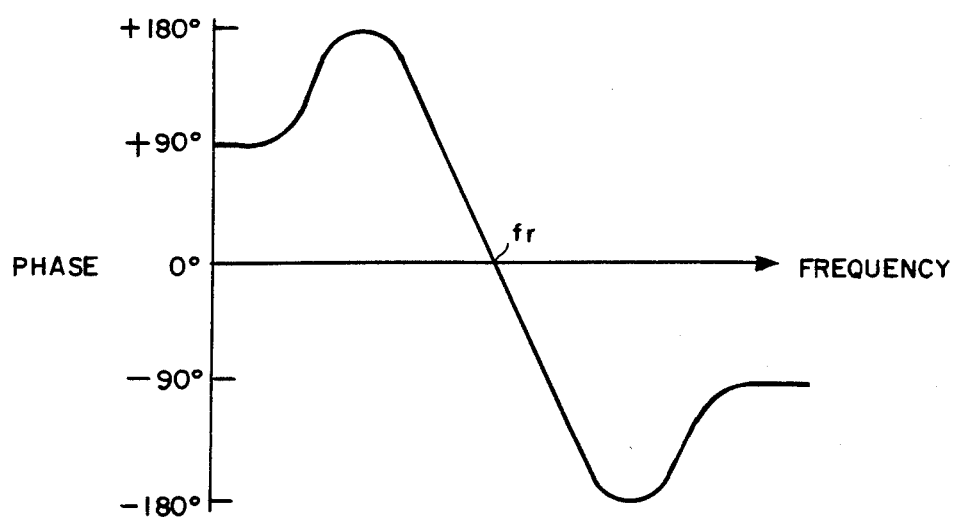
Figure 9:
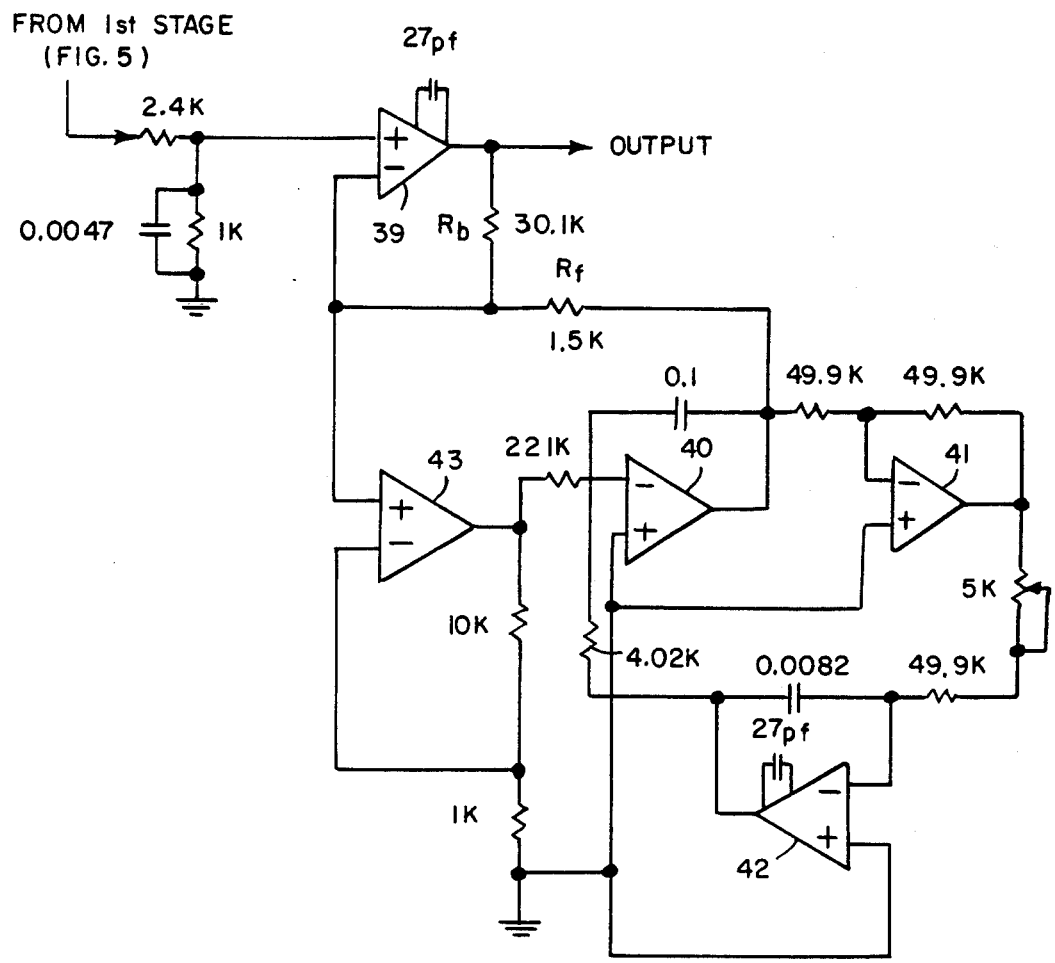
FIG. 9 shows in more detail specific circuitry for a second stage of an overall band-pass amplifier-filter which, when used with the circuit of FIG. 8, forms a two stage amplifier-filter in accordance with the invention.

In order to overcome such instability problem, the second stage of an overall band-pass amplifier-filter of the type shown in FIG. 9 is used. As can be seen therein, such stage requires only the direct transmission path op-amp 39 and the bi-quad amplifier comprising op-amps 40, 41 and 42 and op-amp 43 in the lower impedance path. A feedback op-amp equivalent to that of op-amp 31 of FIG. 8 is not used. Consequently, the circuit of FIG. 9 has the open loop amplitude and phase characteristics shown by dashed-line curves 23 and 22 of FIG. 6. Accordingly the combined stages of FIGS. 8 and 9 provide overall open loop amplitude and phase characteristics as shown in FIG. 7. The phase is 0° at the resonant frequency $f_r$ and has an extremely high gain at $f_r$.

With overall open loop amplitude and phase characteristics shown in FIG. 7 the two stage band-pass amplifier can provide closed loop characteristics shown in FIG. 3 as discussed below.

In each stage the values of resistances $R_b$ and $R_f$ are selected in a particular embodiment to be in a ratio of about 20 to 1, although in some applications it may be smaller and in any event should be greater than 1.0. Because of a ratio of greater than 1.0, no matter how high the input to the band-pass amplifier-filter may go, the bi-quad amplifiers do not overload (the transmission path amplifiers always overload before the bi-quad amplifiers but can recover relatively easily) so that easy recovery from overload no longer becomes a problem in whatever application the overall amplifier may be used.

Figure 10:
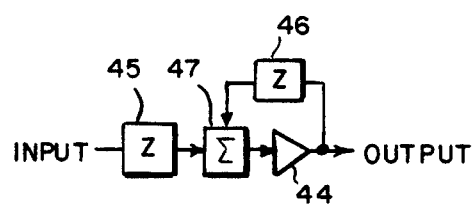
FIGS. 10 and 11 show general closed loop circuit configurations in which band-pass amplifier-filters of the invention can be used.
Figure 11:
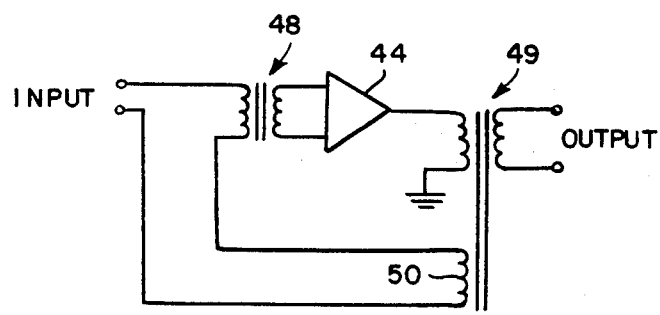

Exemplary applications of such closed loop band-pass amplifier-filter circuits are shown in FIGS. 10 and 11. Thus, in the relatively simple closed loop feedback circuit context of FIG. 10 the band-pass amplifier-filter 44 is supplied with an input signal via an impedance 45 and a signal combining circuit 47. A feedback impedance 46 is connected from the output of the amplifier-filter 44 to the combining circuit 47. The impedances are arranged so that they each provide the same phase shift, i.e., both are resistances, both are capacitances, both are inductances, or both are more complex impedances which have equivalent phase characteristics.

In the closed loop context of FIG. 11 the band-pass amplifier-filter 44 is supplied with a signal from an input transformer 48 and, in turn, supplies its output signal to an output transformer 49. A feedback winding 50 of transformer 49 supplies a feedback signal to the input primary winding of input transformer 47.

The closed loop response of the circuits of FIGS. 10 and 11 are generally as shown in FIG. 3. The circuits have stable operation which cannot be adversely affected by the impedances in FIG. 10. The use of transformers often tends to aggravate stability problems in conventional amplifier circuits because of the phase shifts introduced by their use in the circuit. However, in the configuration of FIG. 11, with adequately designed transformers the phase characteristics of the transformers do not become significant except at frequencies far off the resonance frequency $f_r$, at which extreme frequencies the closed loop gain of the overall circuit has dropped to such a low level (far below unity gain) that the transformer effect is negligible even if the transformers introduce sufficient phase shifts to produce an overall phase shift of 180°. The use of such transformer configuration is advantageous in that it provides a fixed gain amplifier circuit which is extremely stable and in which the gain can be precisely predetermined. For example, in circuits in which the ratio transformers thereof have an error which is within one part in $10 \times 10^6$, for an open loop gain of $25 \times 10^6$, the closed loop gain can be predetermined to within one part in $10 \times 10^6$.

While the above description discloses particular embodiment of the invention, modifications thereof within the spirt and scope of the invention may occur to those in the art. Hence, the invention is not to be limited to the specific embodiments describe except as defined by the appended claims.

What is claimed is:

1. An amplifier-filter circuit for amplifying and filtering an input signal, comprising:
   an amplifier circuit, having inverting and non-inverting inputs and a high gain factor, for providing an output signal representative of the difference between signals applied to the inverting and non-inverting inputs;
   feedback resistance means, connected between the output and the inverting input of the amplifier means, for providing a selected resistance;
   means for applying the input signal to the amplifier means non-inverting input;
   active filter circuit means, responsive to a signal applied to an input thereto and having a bandpass transfer function centered around a selected resonance frequency, for providing a filtered output signal at an output thereof;
   second means for applying the signal at the amplifier means inverting input to the active filter circuit means input; and
   coupling resistance means, connected between the active filter circuit means output and the amplifier circuit inverting input, and having a resistance less than said first feedback resistance means;
   the active filter circuit means, second means for applying, and coupling resistance means being connected between the amplifier circuit inverting input and ground so as to provide a variable impedance which appears as a series-resonant tuned filter having a resonance frequency substantially equal to said selected resonance frequency.

2. An amplifier-filter circuit in accordance with claim 1 wherein said active filter circuit means includes a bi-quad amplifier circuit.

3. An amplifier-filter circuit in accordance with claim 2 wherein the ratio of the values of said feedback resistance means to said coupling resistance means is greater than 2:1.

4. An amplifier-filter circuit in accordance with claim 3 wherein said ratio is about 20:1.

5. An amplifier-filter circuit in accordance with claim 2 wherein said second means for applying includes a first amplifier means responsive to the signal at said inverting input, said bi-quad amplifier circuit being responsive to the output of said amplifier means.

6. An amplifier-filter circuit in accordance with claim 5 and further including further circuit means for substantially reducing to zero the gain of said amplifier-filter circuit at frequencies other than frequencies at or substantially near said selected resonant frequency.

7. An amplifier-filter circuit in accordance with claim 6 wherein the first means for applying includes:
   a preamplifier circuit responsive to said input signal for applying a pre-amplified input signal to said amplifier-filter circuit.

8. An amplifier-filter circuit in accordance with claim 7 and further including a feedback circuit means connected between the inverting input of the amplifier circuit of said amplifier-filter circuit and the input to said preamplifier circuit for substantially eliminating any D-C offset signal which may be present at the output of said preamplifier circuit.

9. An amplifier-filter circuit having two stages and comprising:

first and second amplifier-filter circuits, each in accordance with claim 2;

said first stage amplifier-filter circuit further including circuit means for reducing to substantially zero the gain of said amplifier-filter circuit at frequencies other than frequencies at or substantially near said selected resonant frequency;

whereby said two-stage amplifier-filter circuit has an open loop response such that the amplitude of the output signal therefrom has a peak at or substantially near said selected resonant frequency and reduces to zero at frequencies other than at or near said resonant frequency and such that the phase of said output signal (a) is ±90° at frequencies substantially remote from said resonant frequency, (b) rises to ±180° at frequencies nearer to said resonant frequencies than said remote frequencies, and (c) passes through 0° at said resonant frequency; and whereby said two stage amplifier-filter circuit has a closed loop response such that the amplitude of the output signal therefrom has a peak at or substantially near said resonant frequency and is reduced to zero at frequencies other than at or near said resonant frequency and such that the phase of said output signal is zero at or substantially near said resonant frequency and is ±90° at frequencies other than at or near said resonant frequency.

10. An amplifier-filter circuit in accordance with claim 9 wherein the ratio of the values of the feedback resistance means to the coupling resistance means in each of said amplifier-filter stages is greater than 2:1.

11. An amplifier-filter circuit in accordance with claim 10 wherein said ratio is about 20:1.

* * * * *